(12) United States Patent
Jeong (10) Patent No.: US 7,719,342 B2
(45) Date of Patent: May 18, 2010

(54) INPUT LATCH CIRCUIT HAVING FUSES FOR ADJUSTING A SETUP AND HOLD TIME

(75) Inventor: Hoe Gwon Jeong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/164,271

(22) Filed: Jun. 30, 2008

(65) Prior Publication Data

US 2009/0231010 A1    Sep. 17, 2009

(30) Foreign Application Priority Data

Mar. 13, 2008    (KR) ...................... 10-2008-0023562

(51) Int. Cl.
*H01H 37/76* (2006.01)
(52) U.S. Cl. ...................... 327/525; 365/225.7; 365/96; 327/185; 327/201
(58) Field of Classification Search ................. 327/185, 327/198–199, 141, 142, 155, 161, 201–203, 327/205, 214, 215, 218, 293, 535, 538, 525; 365/189.05, 96, 225.7
See application file for complete search history.

(56) References Cited

U.S. PATENT DOCUMENTS

| | | | | |
|---|---|---|---|---|
| 6,812,764 | B2 * | 11/2004 | Jung | .......................... 327/262 |
| 6,924,685 | B2 * | 8/2005 | Bae | ............................. 327/276 |
| 7,057,951 | B2 * | 6/2006 | Im et al. | ...................... 365/203 |
| 7,117,382 | B2 * | 10/2006 | Khieu et al. | ................. 713/401 |
| 7,196,965 | B2 * | 3/2007 | Han et al. | .............. 365/230.06 |
| 7,265,596 | B2 * | 9/2007 | Kang et al. | .................. 327/161 |
| 7,459,957 | B2 * | 12/2008 | Kim et al. | .................... 327/525 |
| 2007/0014164 | A1 * | 1/2007 | Lee, II | ......................... 365/193 |
| 2007/0097773 | A1 * | 5/2007 | Nishioka et al. | ......... 365/225.7 |
| 2009/0103352 | A1 * | 4/2009 | Kim | ........................... 365/149 |

FOREIGN PATENT DOCUMENTS

| KR | 1020020095686 A | 12/2002 |
|---|---|---|
| KR | 1020070069880 A | 7/2007 |

* cited by examiner

*Primary Examiner*—Lincoln Donovan
*Assistant Examiner*—Shikha Goyal
(74) *Attorney, Agent, or Firm*—Ladas & Parry LLP (57) ABSTRACT

An input latch circuit of a semiconductor device includes a setup time adjusting unit configured to selectively delay a clock signal and a hold time adjusting unit configured to selectively delay an input signal. The input latch circuit also includes a latch unit configured to latch an output signal of the hold time adjusting unit according to an output signal of the setup time adjusting unit. The input latch circuit changes and delays the clock signal and the input signal by cutting a fuse within the setup time adjusting unit and the hold time adjusting unit without requiring a change to a circuit in order to adjust a setup time and a hold time.

8 Claims, 9 Drawing Sheets

INPUT LATCH CIRCUIT HAVING FUSES FOR ADJUSTING A SETUP AND HOLD TIME

CROSS-REFERENCE TO RELATED APPLICATIONS

The present application claims priority to Korean Patent Application No. 10-2008-0023562, filed on Mar. 13, 2008, which is incorporated herein by reference in its entirety.

BACKGROUND OF THE INVENTION

The present invention relates generally to a semiconductor device, and more particularly, to a technology for adjusting a setup time and a hold time using external manipulation such as fuse cutting.

A latch circuit refers to a circuit that maintains a signal inputted to a semiconductor device for a given period of time.

Figure 1:
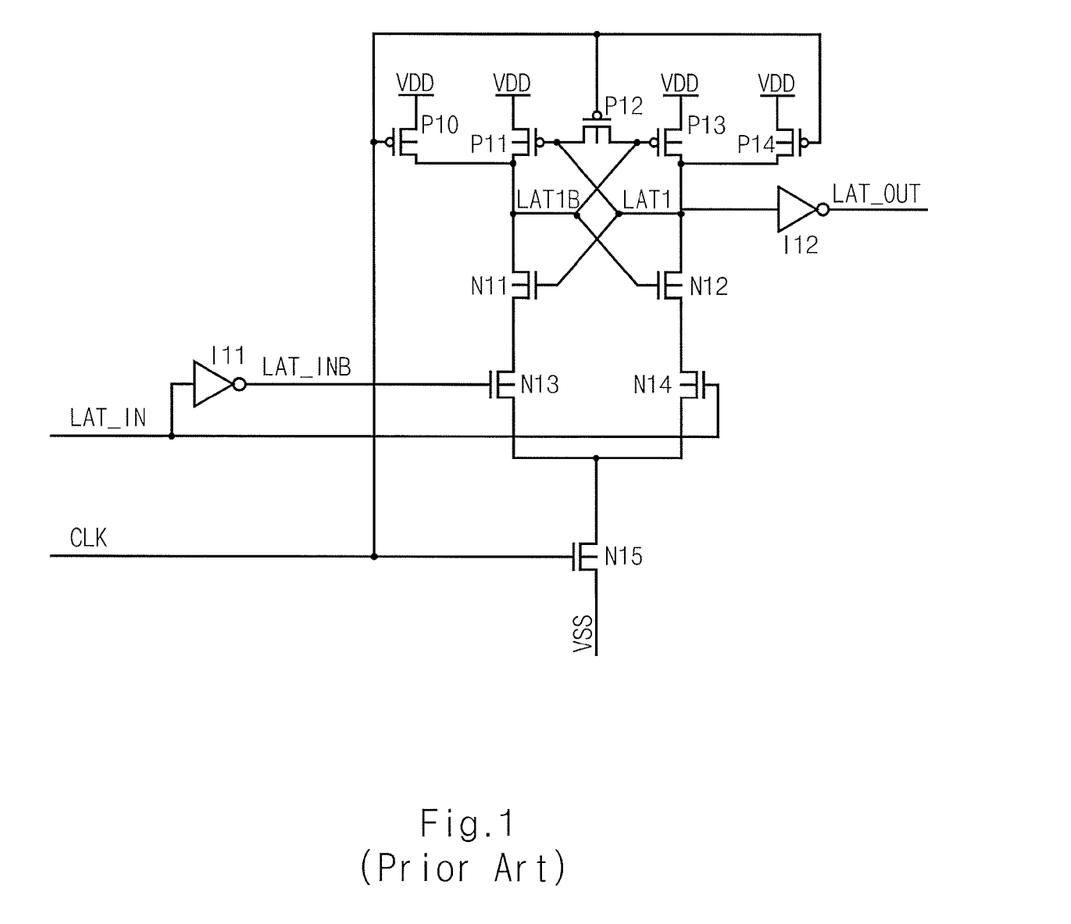
FIG. 1 is a circuit diagram showing an input latch circuit according to the conventional art.
Figure 2:
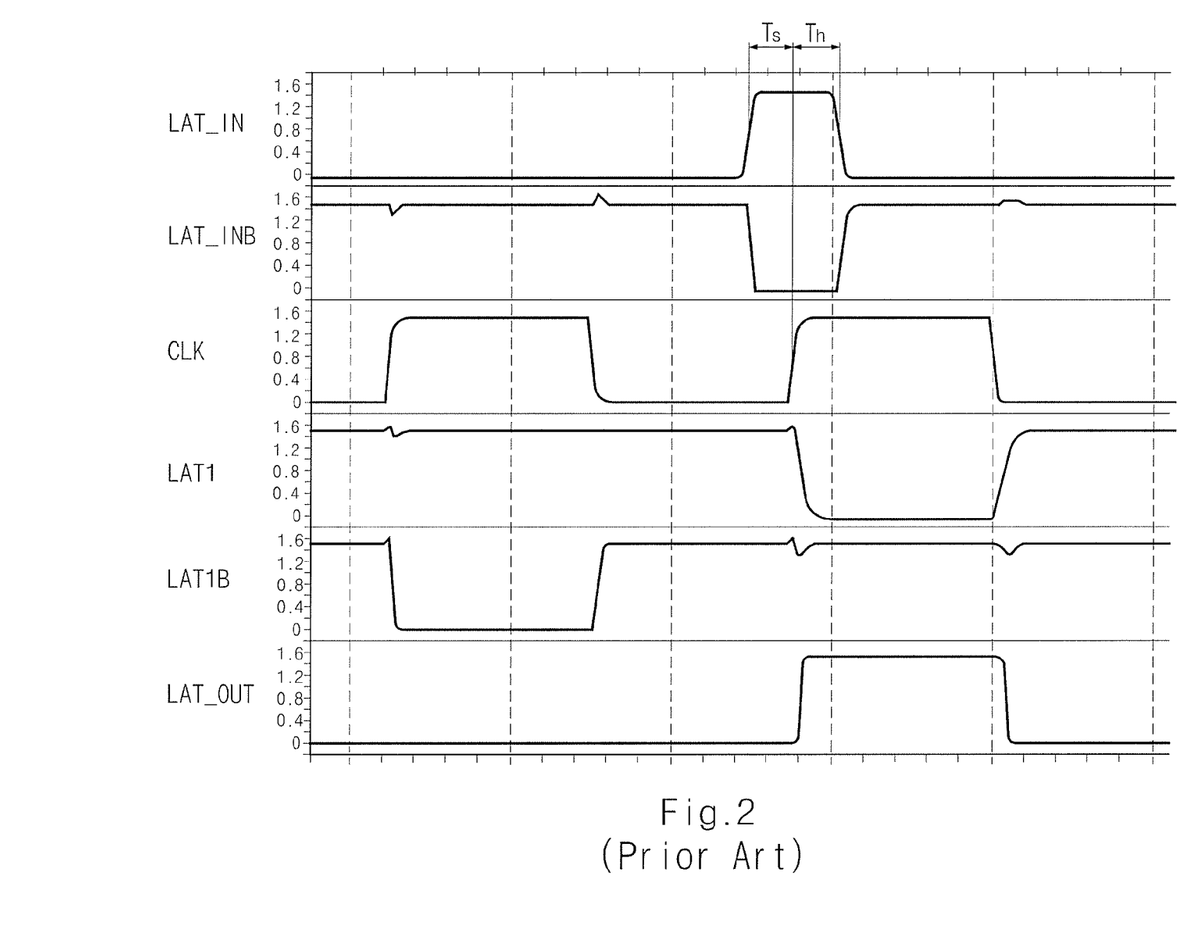
FIG. 2 is a timing diagram illustrating the operation of the input latch circuit shown in FIG. 1.

FIG. 1 is a circuit diagram showing an input latch circuit according to the conventional art. FIG. 2 is a timing diagram illustrating the operation of the input latch circuit shown in FIG. 1.

The input latch circuit according to the conventional art comprises a plurality of PMOS transistors P10~P14, a plurality of NMOS transistors N11~N15, and inverters I11 and I12.

The latch circuit performs a latch operation according to an input signal LAT_IN and a clock signal CLK. FIG. 2 illustrates how the latch circuit is synchronized with respect to a rising edge of the clock signal CLK to latch the input signal LAT_IN.

The input signal LAT_IN transits to a high level when the clock signal CLK is at a low level. The PMOS transistors P11, P14, P12 and the NMOS transistors N11, N12, N14 are turned on so that nodes LAT1, LAT1B are at a high level.

While the input signal LAT_IN maintains the high level, the clock signal CLK transits to a high level. The NMOS transistor N15 is then turned on so that the node LAT1 transits to a low level. As a result, an output signal LAT_OUT is outputted and maintains a high level. The PMOS transistor P12 is turned on so that the node LAT1B maintains the high level. The PMOS transistor P13 is turned off.

The input signal LAT_IN and the clock signal CLK then transit to a low level. The PMOS transistor P14 is turned on to transit the node LAT1 to a high level. As a result, the output signal LAT_OUT is transits to a low level. The PMOS transistor P11 is then turned on to maintain the node LAT1B at the high level.

As shown in FIG. 2, the latch circuit receives data using the clock signal CLK and requires receiving a signal before the clock signal CLK transits levels. Even after a phase of the clock signal CLK changes, the signal input must continue for a given period of time.

A setup time (Ts) refers to a time period in which a signal must be inputted before the clock signal CLK transits levels. A hold time (Th) refers to a time period during which the signal input is maintained after the clock signal CLK transits levels.

If the setup time and the hold time are not maintained for a given time in the latch circuit, the input data is not latched an error is generated as a result. Accordingly, the setup time and the hold time must be properly adjusted when they are incorrectly set. In order to adjust the setup time and the hold time, the structure of the circuit supplying the input signal LAT_IN and the clock signal CLK to the latch circuit must be changed in the conventional semiconductor device.

However, if the circuit is changed, a great deal of time is required until the circuit may be applied to a final wafer. As a result, it takes a large amount of time to develop a device.

SUMMARY OF THE INVENTION

The present invention includes an input latch circuit configured to adjust a setup time and a hold time using external manipulation without changing the circuit.

According to an embodiment of the present invention, an input latch circuit comprises: a setup time adjusting unit configured to delay a clock signal selectively; and a latch unit configured to latch an input signal in response to an output signal of the setup time adjusting unit.

According to an embodiment of the present invention, an input latch circuit comprises: a hold time adjusting unit configured to delay an input signal selectively; and a latch unit configured to latch an output signal of the hold time adjusting unit in response to a clock signal.

According to an embodiment of the present invention, an input latch circuit comprises: a setup time adjusting unit configured to selectively delay a clock signal; a hold time adjusting unit configured to delay an input signal selectively; and a latch unit configured to latch an output signal of the hold time adjusting unit in response to an output signal of the setup time adjusting unit.

DESCRIPTION OF SPECIFIC EMBODIMENTS

Figure 3:
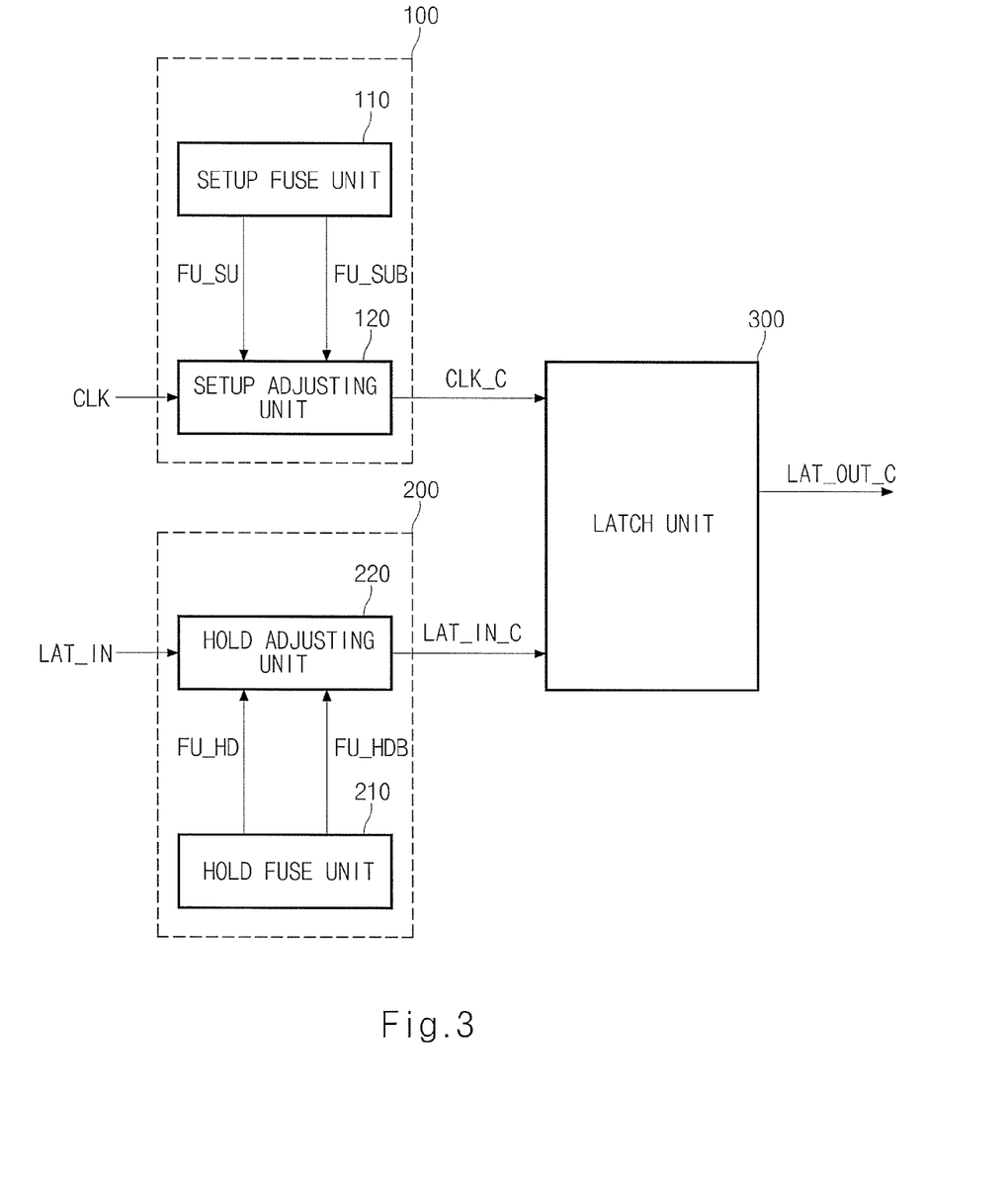
FIG. 3 is a diagram showing an input latch circuit according to an embodiment of the present invention.

FIG. 3 is a diagram showing an input latch circuit according to an embodiment of the present invention.

The input latch circuit of FIG. 3 comprises a setup time adjusting unit 100, a hold time adjusting unit 200, and a latch unit 300.

The setup time adjusting unit 100 selectively delays a clock signal CLK according to whether a fuse is cut and outputs the clock signal CLK to the latch unit 300. That is, when the fuse is not cut, the setup time adjusting unit 100 passes the clock signal CLK to the latch unit 300 without a delay. When the fuse is cut, the setup time adjusting unit 100 delays the clock signal CLK for a given period of time and outputs the delayed clock signal CLK to the latch unit 300.

The setup time adjusting unit 100 includes a setup fuse unit 110 and a setup adjusting unit 120. The setup fuse unit 110 outputs setup adjusting signals FU_SU, FU_SUB for adjusting a setup time depending on whether the fuse is cut. The setup adjusting unit 120 selectively delays the clock signal CLK according to the setup adjusting signals FU_SU, FU_SUB and outputs an output signal CLK_C to the latch unit 300.

The hold time adjusting unit 200 selectively adjusts a pulse width of an input signal LAT_IN and outputs the input signal to the latch unit 300 according to whether the fuse is cut. That is, when the fuse is not cut, the hold time adjusting unit 200 passes the input signal LAT_IN to the latch unit 300 without any pulse adjustment. When the fuse is cut, the hold time adjusting unit 200 delays the pulse width of the input signal LAT_IN for a given period of time and outputs the adjusted input signal to latch unit 300.

The hold time adjusting unit 200 includes a hold fuse unit 210 and a hold adjusting unit 220. The hold fuse unit 210 outputs hold adjusting signals FU_HD, FU_HDB for adjusting a hold time depending on whether the fuse is cut. The hold adjusting unit 220 selectively delays the pulse width of the input signal LAT_IN according to the hold adjusting signals FU_HD, FU_HDB and outputs an output signal LAT_IN_C to the latch unit 300.

The latch unit 300 latches the output signal LAT IN_C from the hold time adjusting unit 200 according to the output signal CLK_C received from the setup time adjusting unit 100.

Figure 4:
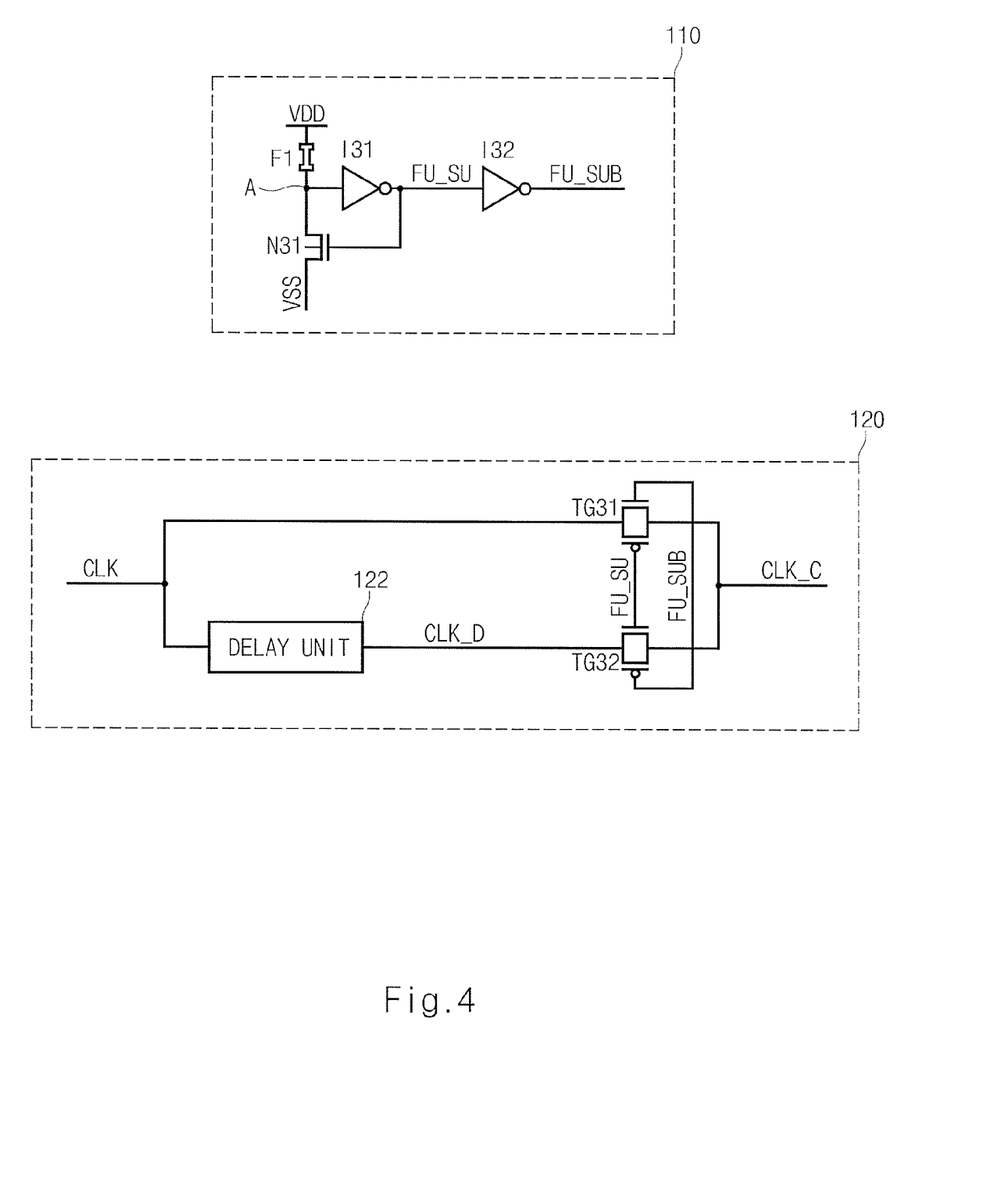
FIG. 4 is a circuit diagram showing a setup fuse unit and a setup adjusting unit of FIG. 3.

FIG. 4 is a circuit diagram showing the setup fuse unit 110 and the setup adjusting unit 120 of FIG. 3.

The setup fuse unit 110 includes a fuse F1, a NMOS transistor N31, and inverters I31, I32. The fuse F1 is connected between a power voltage VDD terminal and a node A. The NMOS transistor N31 connected between the node A and a ground voltage VSS terminal and has a gate receiving the setup adjusting signal FU_SU. The inverter I31 inverts a signal of node A and outputs the setup adjusting signal FU_SU. The inverter I32 inverts the setup adjusting signal FU_SU and outputs the setup adjusting signal FU_SUB.

The setup adjusting unit 120 includes a delay unit 122 and transmission gates TG31, TG32. The delay unit 122 delays the clock signal CLK for a given period of time and outputs a delayed signal CLK_D. The transmission gate TG31 selectively outputs the clock signal CLK according to the setup adjusting signals FU_SU, FU_SUB from the setup fuse unit 110. The transmission gate TG32 selectively outputs the delayed signal CLK_D according to the setup adjusting signals FU_SU, FU_SUB.

The transmission gate TG31 switches complementary to the transmission gate TG32. When the setup adjusting signal FU_SUB is at a high level, the setup adjusting unit 120 passes the clock signal CLK as the output signal CLK_C without a delay. When the setup adjusting signal FU_SU is at a high level, the setup adjusting unit 120 outputs the delayed signal CLK_D as the output signal CLK_C.

Hereinafter, operation of the setup fuse unit 110 and the setup adjusting unit 120 are described.

When the fuse F1 is not cut, node A receives a power voltage VDD through the fuse F1 such that node A maintains a high level. As a result, the setup adjusting signal FU_SU is at a low level and the setup adjusting signal FU_SUB is outputted at a high level.

When the setup adjusting signal FU_SU is at a low level and the setup adjusting signal FU_SUB is at a high level, the transmission gate TG31 is turned on and transmits the clock signal CLK as the output signal CLK_C to the latch unit 300.

When the fuse F1 is cut, node A transits to a low level due to a leakage current of the NMOS transistor N31. As a result, the setup adjusting signal FU_SU is at a high level and the setup adjusting signal FU_SUB is at a low level. When the setup adjusting signal FU_SU transits to a high level, the NMOS transistor N31 is turned on so that node A maintains a ground voltage VSS level.

When the setup adjusting signal FU_SU is at a high level and the setup adjusting signal FU_SUB is at a low level, the transmission gate TG31 is turned off and the transmission gate TG32 is turned on. As a result, the delayed signal CLK_D from the delay unit 122 is outputted to the latch unit 300 as the output signal CLK_C through the transmission gate TG32.

Figure 5:
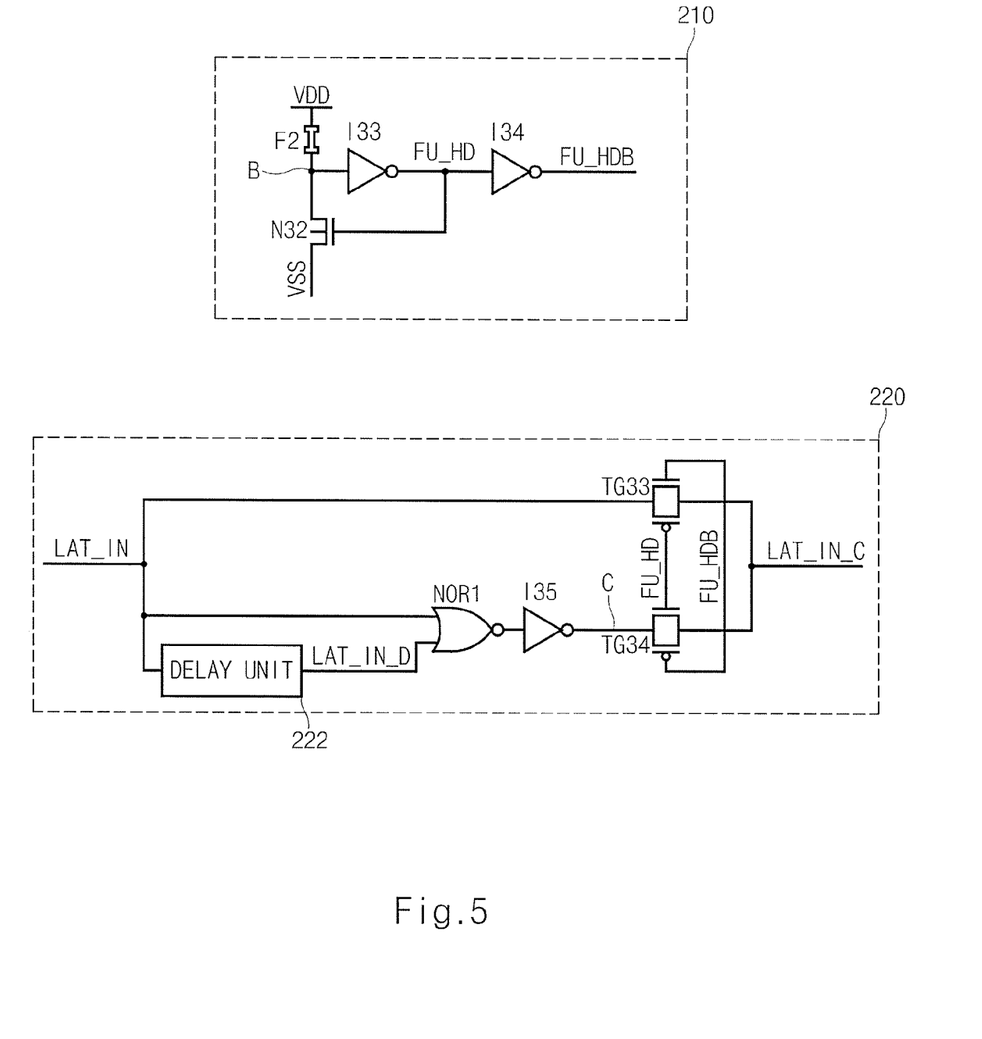
FIG. 5 is a circuit diagram showing a hold fuse unit and a hold adjusting unit of FIG. 3.

FIG. 5 is a circuit diagram showing the hold fuse unit 210 and the hold adjusting unit 220 of FIG. 3.

The hold fuse unit 210 includes a fuse F2, a NMOS transistor N32, and inverters I33, I34. The fuse F2 is connected between the power voltage VDD terminal and a node B. The NMOS transistor N32 is connected between the node B and the ground voltage VSS terminal and has a gate receiving the hold adjusting signal FU_HD. The inverter I33 inverts a signal of node B and outputs the hold adjusting signal FU_HD. The inverter I34 inverts the hold adjusting signal FU_HD and outputs the hold adjusting signal FU_HDB.

The hold adjusting unit 220 includes a delay unit 222, a NOR gate NOR1, an inverter I35, and transmission gates TG33, TG34.

The transmission gate TG33 selectively outputs the input signal LAT_IN according to the hold adjusting signals FU_HD, FU_HDB from the hold fuse unit 210. The delay unit 222 delays the input signal LAT_IN for a given period of time and outputs a delayed signal LAT_IN_D.

The NOR gate NOR1 performs a NOR operation on the input signal LAT_IN and a delayed signal LAT_IN_D. The inverter I35 inverts an output signal of the NOR gate NOR1. The transmission gate TG34 selectively outputs an output signal of the inverter I35 to the latch unit 300 as output signal LAT_IN_C according to the hold adjusting signals FU_HD, FU_HDB.

Hereinafter, the operations of the hold fuse unit 210 and the hold adjusting unit 220 are described.

When the fuse F2 is not cut, node B receives a power voltage VDD through the fuse F2 such that node B maintains a high level. As a result, the hold adjusting signal FU_HD is at a low level and the hold adjusting signal FU_HDB is outputted at a high level.

When the hold adjusting signal FU_HD is at a low level and the hold adjusting signal FU_HDB is at a high level, the transmission gate TG33 is turned on and transmits the input signal LAT_IN as the output signal LAT_IN_C to the latch unit 300.

When the fuse F2 is cut, node B transits to a low level due to a leakage current of the NMOS transistor N32. As a result, the hold adjusting signal FU_HD is at a high level and the hold adjusting signal FU_HDB is at a low level. When the hold adjusting signal FU_HD transits to a high level, the NMOS transistor N32 is turned on so that node B maintains a ground voltage VSS level.

When the hold adjusting signal FU_HD is at a high level and the hold adjusting signal FU_HDB is at a low level, the transmission gate TG33 is turned off and the transmission gate TG34 is turned on.

When the input signal LAT_IN has a high level and is applied to the NOR gate NOR1, a node C transits to a high level and transmits the output signal LAT_IN_C to the latch unit 300 through the transmission gate TG34. The input signal LAT_IN is delayed for a given period of time by the delay unit 222 and applied to the NOR gate NOR1.

The output signal LAT_IN_C of the hold adjusting unit 220 does not immediately transit to a low level even when the input signal LAT_IN transits to a low level. That is, the output signal LAT_IN_C maintains a high level until the delay signal LAT_IN_D is transits to a low level.

Figure 6:
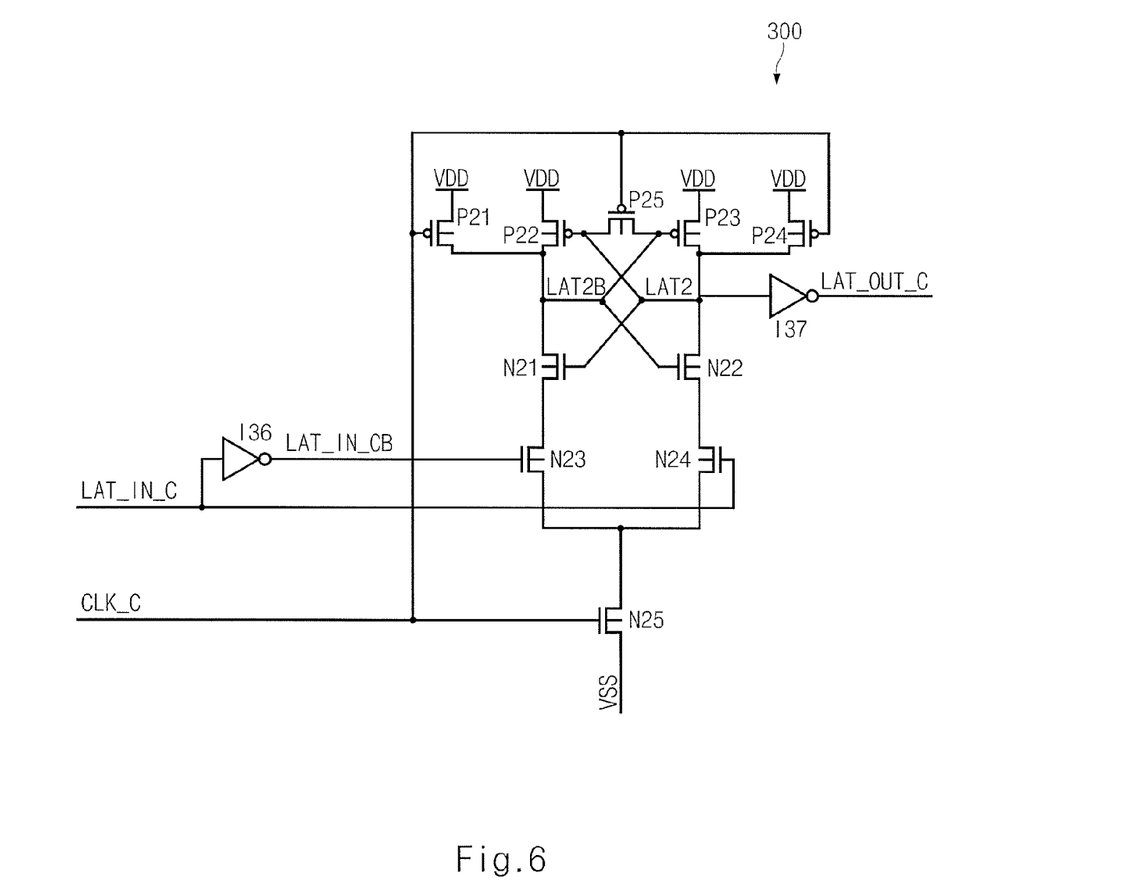
FIG. 6 is a circuit diagram showing a latch unit according to an embodiment of the present invention.

FIG. 6 is a circuit diagram showing the latch unit 300 according to an embodiment of the present invention.

The latch unit 300 includes inverters I36, I37, PMOS transistors P21~P25, and NMOS transistors N21~N25.

The inverter I36 inverts the output signal LAT_IN_C of the hold adjusting unit 220 and outputs an input signal LAT_IN_CB. The PMOS transistor P21 is connected between the power voltage VDD terminal and a node LAT2B and has a gate receiving the output signal CLK_C of the setup adjusting unit 120. The PMOS transistor P22 is connected between the power voltage VDD terminal and the node LAT2B and has a gate connected to a node LAT2. The PMOS transistor P23 is connected between the power voltage VDD terminal and node LAT2 and has a gate connected to node LAT2B. The PMOS transistor P24 is connected between the power voltage VDD terminal and node LAT2 and has a gate receiving the output signal CLK_C of the setup adjusting unit 120. The PMOS transistor P25 is connected between the gates of the PMOS transistors P22, P23 and has a gate receiving the output signal CLK_C of the setup adjusting unit 120.

The NMOS transistor N21 is connected between node LAT2B and the NMOS transistor N23 and has a gate connected to node LAT2. The NMOS transistor N23 is connected between the NMOS transistors N21 and the NMOS transistor N25 and has a gate receiving the input signal LAT_IN_CB. The NMOS transistor N22 is connected between node LAT2 and the NMOS transistor N24 and has a gate connected to node LAT2B. The NMOS transistor N24 is connected between the NMOS transistors N22 and the NMOS transistor N25 and has a gate receiving the output signal LAT_IN_C of the hold adjusting unit 220. The NMOS transistor N25 is connected between a common node of the NMOS transistors N23, N24 and the ground voltage VSS terminal and has a gate receiving the output signal CLK_C of the setup adjusting unit 120. The inverter I37 inverts a signal of the node LAT2 and outputs an output signal LAT_OUT_C.

Figure 7:
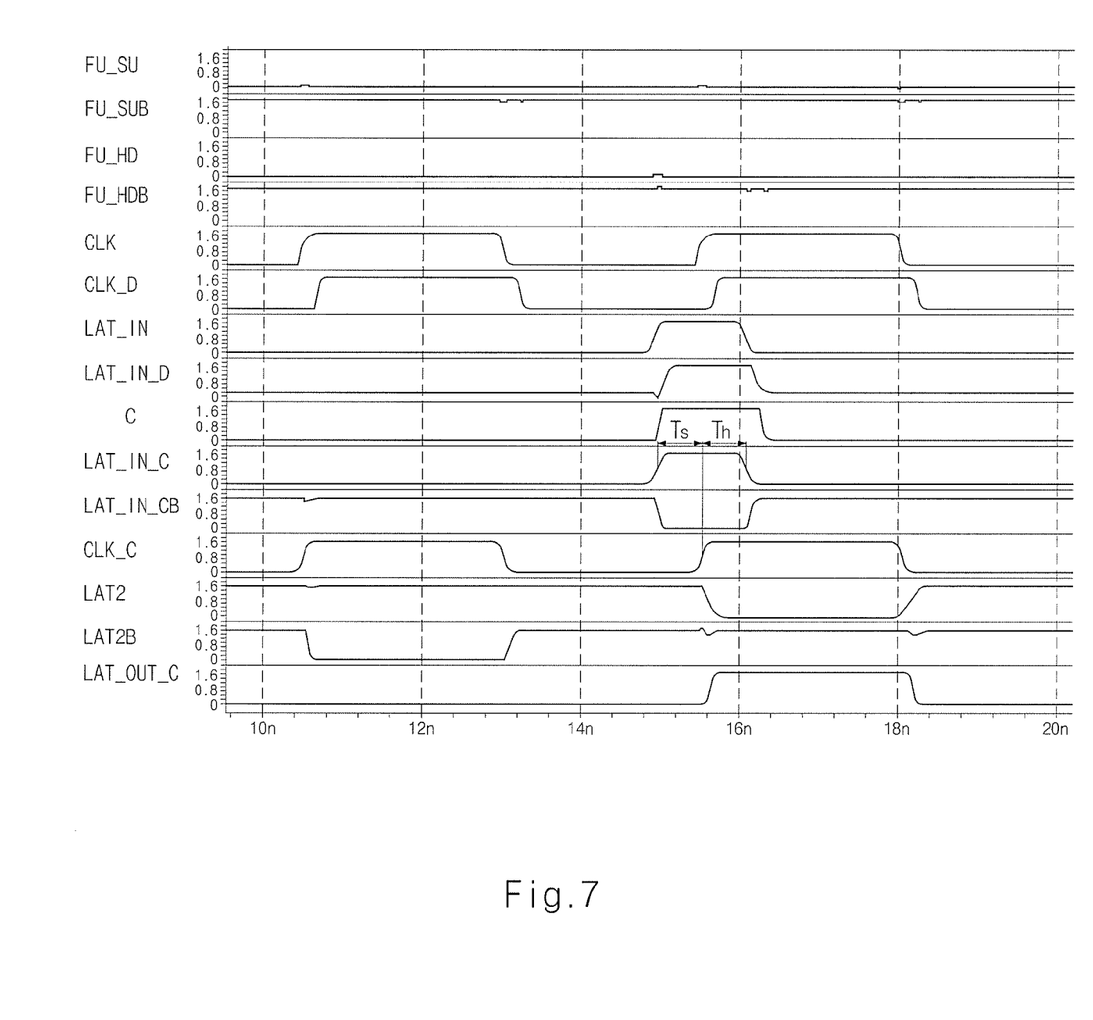
FIG. 7 is a timing diagram illustrating the operation of the input latch circuit according to an embodiment of the present invention when a fuse of a setup fuse unit and a fuse of a hold fuse unit are not cut.

FIG. 7 is a timing diagram illustrating the operation of the input latch circuit according to an embodiment of the present invention when the fuse F1 of the setup fuse unit 110 and the fuse F2 of the hold fuse unit 210 are not cut.

When the fuses F1 and F2 are not cut, the setup adjusting signal FU_SU and the hold adjusting signal FU_HD are outputted at a low level. The setup adjusting signal FU_SUB and the hold adjusting signal FU_HDB are therefore outputted at a high level.

The transmission gates TG31, TG33 are turned on and the transmission gates TG32, TG34 are turned off. The clock signal CLK and the input signal LAT_IN are transmitted to the latch unit 300 unmodified through the transmission gates TG31, TG33.

That is, when the fuses F1, F2 are not cut, the setup adjusting unit 120 and the hold adjusting unit 220 transmit the clock signal CLK and the input signal LAT_IN to the latch unit 300 without any modification.

Figure 8:
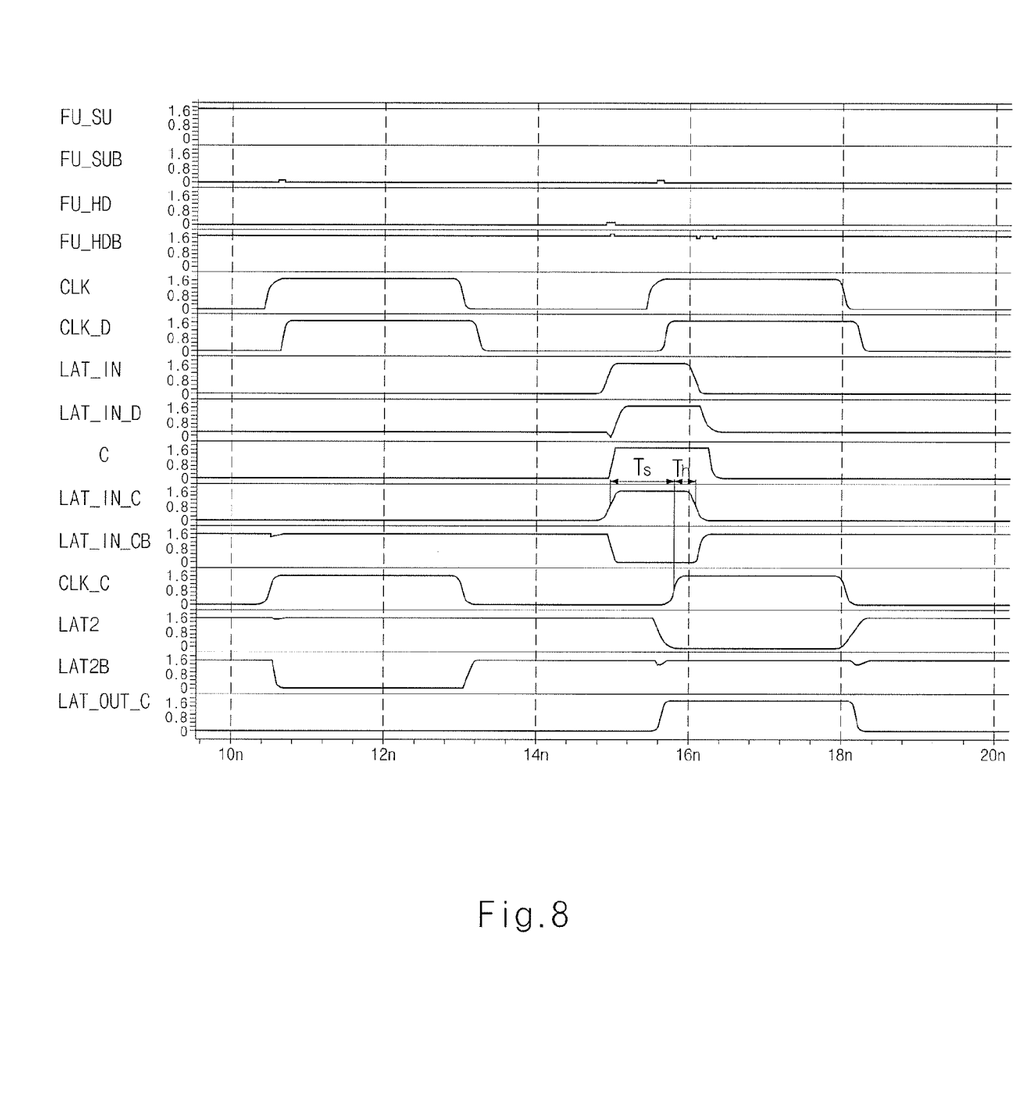
FIG. 8 is a timing diagram illustrating the operation of the input latch circuit according to an embodiment of the present invention when the fuse of the setup fuse unit is cut.

FIG. 8 is a timing diagram illustrating the operation of the input latch circuit according to an embodiment of the present invention when the fuse F1 of the setup fuse unit 110 is cut.

When the fuse F1 is cut and the fuse F2 is not cut, the setup adjusting signal FU_SU transits to a high level. The transmission gate TG31 is turned off and the transmission gate TG32 is turned on. The clock signal CLK is delayed for a given period of time by the delay unit 122 and applied to the latch unit 300 through the transmission gate TG32 as output clock signal CLK_C.

The input signal LAT_IN is transmitted to the latch unit 300 through the transmission gate TG33 of the hold adjusting unit 220 because the fuse F2 is not cut as shown in FIG. 7.

Comparing FIG. 8 with FIG. 7, the signal LAT_IN_C is identical and is applied to the latch unit 300 while the clock signal CLK_C is delayed for a given period of time as shown in FIG. 8.

The fuse F1 is cut so that the clock signal CLK is delayed for a given period of time while the input signal LAT_IN remains unchanged. As a result, a setup time Ts becomes longer while a hold time becomes shorter.

Figure 9:
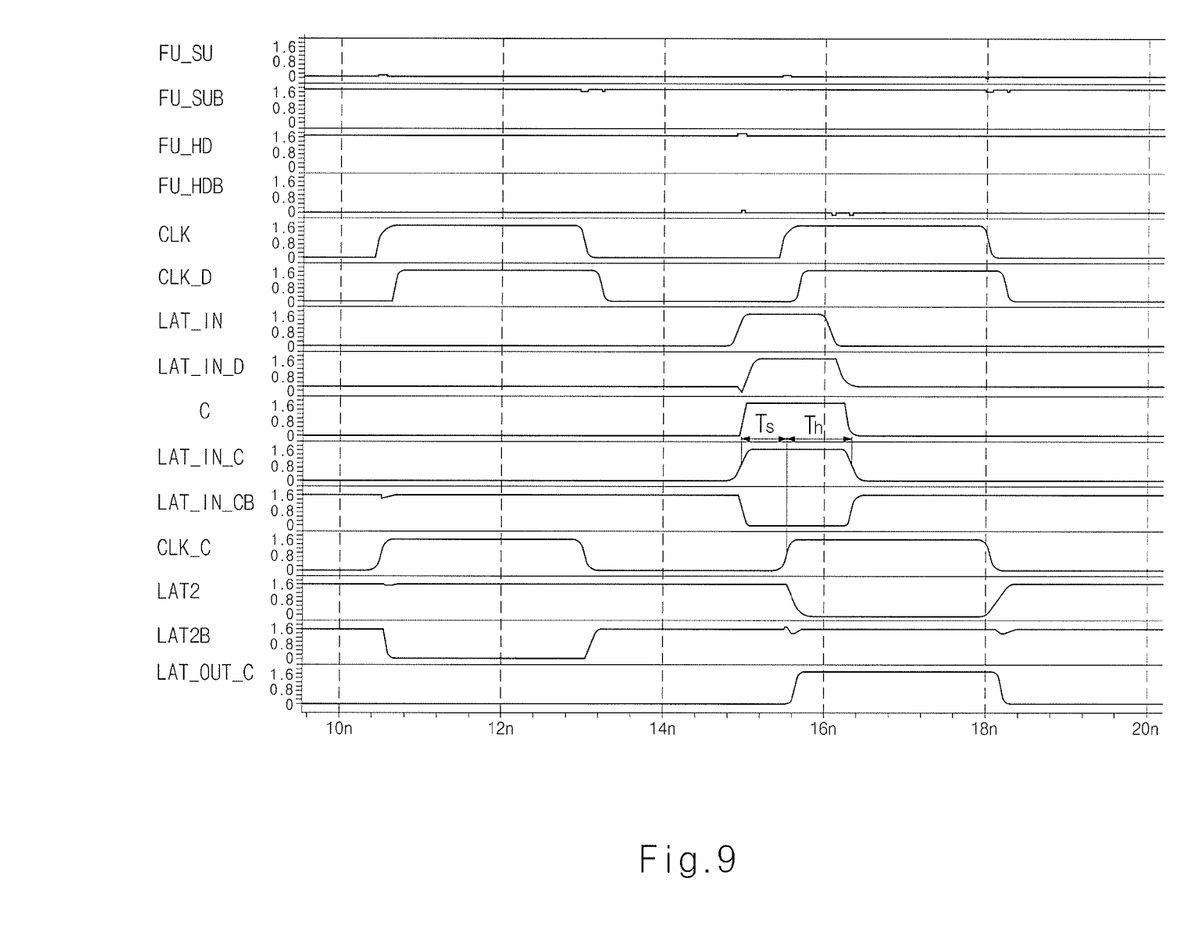
FIG. 9 is a timing diagram illustrating the operation of the input latch circuit according to an embodiment of the present invention when the fuse of the hold fuse unit is cut.

FIG. 9 is a timing diagram illustrating the operation of the input latch circuit according to an embodiment of the present invention when the fuse F2 of the hold fuse unit 210 is cut.

When the fuse F2 is cut and the fuse F1 is not cut, the hold adjusting signal FU_HD transits to a high level. The transmission gate TG33 is turned off and the transmission gate TG34 is turned on.

A pulse width of the input signal LAT_IN is delayed for a given period of time by the delay unit 222 as shown in FIG. 5 and applied to the latch unit 300 through the transmission gate TG34. That is, the output signal LAT_IN_C of the hold adjusting unit 220 has a high level pulse width from when the input signal LAT_IN transits to a high level until the output signal LAT_IN_D of the delay unit 222 transits to a low level.

The clock signal CLK is transmitted to the latch unit 300 through the transmission gate TG31 of the setup adjusting unit 120 because the fuse F1 is not cut as shown in FIG. 7.

Comparing FIG. 9 with FIG. 7, the clock signal CLK_C is identical and is applied to the latch unit 300 while the signal LAT_IN_C is delayed for a given period of time as shown in FIG. 9. That is, the signal LAT_IN_C is transits to a low level later than in FIG. 7.

The fuse F2 is cut so that the input signal LAT_IN is delayed for a given period of time while the signal CLK remains unchanged. As a result, a hold time Th becomes longer. The setup time Ts is similar to that of FIG. 7 because the timing for when the output signal LAT_IN_C transits to a high level is not changed.

Although the embodiment according to the present invention is exemplified when one of the fuses F1, F2 is cut, the present invention is not limited herein. When the fuses F1, F2 are cut, the clock signal CLK_C is delayed for a given period of time and the pulse width of the signal LAT_IN_C is delayed for a given period of time. As a result, both the setup time and the hold time become longer.

Also, although the embodiment according to the present invention is exemplified when the setup time and the hold time are adjusted depending on whether the fuses of the setup fuse unit 110 and the hold fuse unit 120 are cut to simplify the structure of the circuit, the present invention is not limited herein.

For example, physical fuses do not need to be used in the setup fuse unit 110 and the hold fuse unit 210, but rather the fuses may be structured as circuits capable of being programmed externally depending on usage to change output values.

As described above, an input latch circuit according to an embodiment of the present invention adjusts a setup time and a hold time by cutting fuses to reduce the time needed for the development of a device. Also, the input latch circuit stably latches input data.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An input latch circuit comprising:
   a setup time adjusting unit configured to selectively delay an inputted clock signal; and
   a latch unit configured to latch an input signal according to an output signal of the setup time adjusting unit,
   wherein the setup time adjusting unit selectively delays the clock signal according to whether a fuse of the setup time adjusting unit is cut or not,
   wherein the setup time adjusting unit passes the clock signal to the latch unit without a delay when the fuse is not cut, and delays the clock signal for a given period of time and outputs the clock signal to the latch unit and setup time becomes longer than a hold time when the fuse is cut,
   wherein the setup time adjusting unit includes:
   a setup fuse unit configured to activate a setup adjusting signal when the fuse is cut; and
   a setup adjusting unit configured to pass the clock signal to the latch unit without a delay when the setup adjusting signal is deactivated, and to delay the clock signal for a given period of time and output the delayed clock signal to the latch unit when the setup adjusting signal is activated.

2. The input latch circuit according to claim 1, wherein the setup adjusting unit includes:
   a first transmission switching unit configured to turn on when the setup adjusting signal is deactivated to transmit the clock signal to the latch unit without a delay;
   a delay unit configured to delay the clock signal for a given period of time; and
   a second transmission switching unit configured to turn on when the setup adjusting signal is activated to transmit an output signal of the delay unit to the latch unit.

3. An input latch circuit comprising:
   a setup time adjusting unit configured to selectively delay an inputted clock signal;
   a hold time adjusting unit configured to selectively delay an input signal; and
   a latch unit configured to latch an output signal of the hold time adjusting unit according to an output signal of the setup time adjusting unit,
   wherein the setup time adjusting unit selectively delays the clock signal according to whether a first fuse of the setup time adjusting unit is cut or not,
   wherein the setup time adjusting unit passes the clock signal to the latch unit without a delay when he first fuse is not cut, and delays the clock signal for a given period of time and outputs the clock signal to the latch unit and setup time becomes longer than a hold time when the first fuse is cut,
   wherein the setup time adjusting unit includes:
   a setup fuse unit configured to activate a setup adjusting signal when the first fuse is cut; and
   a setup adjusting unit configured to pass the clock signal to the latch unit without a delay when the setup adjusting signal is deactivated, and to delay the clock signal for a given period of time and output the delayed clock signal to the latch unit when the setup adjusting signal is activated.

4. The input latch circuit according to claim 3, wherein the setup adjusting unit includes:
   a first transmission switching unit configured to turn on when the setup adjusting signal is deactivated to transmit the clock signal to the latch unit without a delay;
   a first delay unit configured to delay the clock signal for a given period of time; and
   a second transmission switching unit configured to turn on when the setup adjusting signal is activated to transmit an output signal of the delay unit to the latch unit.

5. The input latch circuit according to claim 3, wherein the hold time adjusting unit selectively delays the input signal according to whether a second fuse of the hold time adjusting unit is cut or not.

6. The input latch circuit according to claim 5, wherein the hold time adjusting unit passes the input signal to the latch unit without a delay when the second fuse is not cut, and delays the input signal for a given period of time and outputs the input signal to the latch unit when the second fuse is cut.

7. The input latch circuit according to claim 6, wherein the hold time adjusting unit includes:
   a hold fuse unit configured to activate a hold adjusting signal when the second fuse is cut; and
   a hold adjusting unit configured to pass the input signal to the latch unit without a delay when the hold adjusting signal is deactivated, and to delay the input signal for a given period of time and output the delayed input signal to the latch unit when the hold adjusting signal is activated.

8. The input latch circuit according to claim 7, wherein the hold adjusting unit includes:
   a third transmission switching unit configured to turn on when the hold adjusting signal is deactivated to transmit the input signal to the latch unit without a delay;
   a second delay unit configured to delay the input signal for a given period of time;
   a logic operation unit configured to perform a NOR operation on the input signal and an output signal of the second delay unit; and
   a fourth transmission switching unit configured to turn on when the hold adjusting signal is activated to transmit an output signal of the logic operation unit to the latch unit.

* * * * *